(12) United States Patent
Heile

(10) Patent No.: US 6,453,382 B1
(45) Date of Patent: Sep. 17, 2002

(54) CONTENT ADDRESSABLE MEMORY ENCODED OUTPUTS

(75) Inventor: Francis B. Heile, Santa Clara, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 09/389,995

(22) Filed: Sep. 2, 1999

Related U.S. Application Data

(60) Provisional application No. 60/107,197, filed on Nov. 5, 1998.

(51) Int. Cl.$^7$ .............................................. G06F 12/00
(52) U.S. Cl. ........................ 711/108; 711/202; 711/203
(58) Field of Search ................................ 711/108, 202, 711/203

(56) References Cited

U.S. PATENT DOCUMENTS

| | | | |
|---|---|---|---|
| 3,473,160 A | 10/1969 | Wahlstrom | 340/172.5 |
| 3,634,829 A | 1/1972 | Campi et al. | 340/172.5 |
| 3,849,638 A | 11/1974 | Greer | 235/152 |
| 4,608,629 A * | 8/1986 | Nagel | |
| 4,740,917 A | 4/1988 | Denis et al. | 365/49 |
| 4,876,466 A | 10/1989 | Kondou et al. | 307/465 |
| 4,912,345 A | 3/1990 | Steele et al. | 307/465 |
| 4,975,601 A | 12/1990 | Steele | 307/465 |
| 5,027,011 A | 6/1991 | Steele | 307/465 |
| 5,099,150 A | 3/1992 | Steele | 307/465 |
| 5,121,006 A | 6/1992 | Pedersen | 307/465 |
| 5,128,559 A | 7/1992 | Steele | 307/465 |
| 5,144,582 A | 9/1992 | Steele | 365/189.08 |
| RE34,363 E | 8/1993 | Freeman | 307/465 |
| 5,270,587 A | 12/1993 | Zagar | 307/469 |
| 5,282,163 A | 1/1994 | Shibata | 365/189.08 |
| 5,302,865 A | 4/1994 | Steele et al. | 307/465 |
| 5,362,999 A | 11/1994 | Chiang | 326/44 |
| 5,383,146 A | 1/1995 | Threewitt | 365/49 |
| 5,386,155 A | 1/1995 | Steele et al. | 326/37 |
| 5,408,434 A | 4/1995 | Stansfield | 365/189.08 |
| 5,450,608 A | 9/1995 | Steele | 395/800 |
| 5,473,267 A | 12/1995 | Stansfield | 326/41 |
| 5,532,957 A | 7/1996 | Malhi | 365/154 |
| 5,550,782 A | 8/1996 | Cliff et al. | 365/230.03 |
| 5,557,218 A | 9/1996 | Jang | 326/40 |
| 5,559,747 A | 9/1996 | Kasamizu-gami et al. | 365/207 |
| 5,574,930 A | 11/1996 | Halverson et al. | 395/800 |
| 5,611,064 A * | 3/1997 | Maund et al. | |
| 5,689,195 A | 11/1997 | Cliff et al. | 326/41 |
| 5,809,281 A | 9/1998 | Steele et al. | 395/497.01 |
| 5,815,726 A | 9/1998 | Cliff | 395/800.01 |
| 5,909,126 A | 6/1999 | Cliff et al. | 326/41 |
| 5,946,704 A | 8/1999 | Yoneda et al. | 711/108 |

OTHER PUBLICATIONS

C. Barre, "L'utilisation du FPLA; Evaluez les Applications d'un Composant Puissant qui Peut se Reveler trés Economique", Electronique & Applications Industrielles, EAI 250, Apr. 1, 1978, pp. 21–25.

(List continued on next page.)

Primary Examiner—Jack A. Lane
(74) Attorney, Agent, or Firm—Fish & Neave; Robert R. Jackson

(57) ABSTRACT

In order to eliminate or substantially eliminate the need for circuitry to encode the address outputs of a content addressable memory which is equipped to perform sum-of-products logic, the memory contents are stored in such a way that the sum-of-products circuitry can encode the address outputs. A data word may be stored at several different locations in the memory, each of those locations being associated with a respective one of the positions or places in the encoded address that is to contain an affirmative response when the stored data word matches an applied data word. The sum-of-products circuitry of the memory is used to logically combine the outputs of the memory associated with each place of the encoded address in order to produce the appropriately encoded address output signal for that place.

5 Claims, 2 Drawing Sheets

OTHER PUBLICATIONS

D. Bursky, "Combination RAM/PLD Opens New Application Options", Electronic Design, May 23, 1991, pp. 138–140.

"iFX8160 10ns FLEXlogic FPGA with SRAM Option; Advance Information", Intel Corporation, Oct. 1993, pp. 2–47 through 2–56.

"iFX780 10ns FLEXlogic FPGA with SRAM Option; Preliminary", Intel Corporation, Nov. 1993, Order No. 290459–004, pp. 2–24 through 2–46.

T. K–K. Ngai, "An SRAM–Programmable Field–Reconfigurable Memory", Master of Applied Science degree thesis submitted to the Department of Electrical Engineering of the University of Toronto, 1994.

A. Stansfield et al., "The Design of a New FPGA Architecture", Proceedings Field Programmable Logic (FPL) 1995, Springer Lecture Notes in Computer Science 975, pp. 1–14.

A. Kaviani et al., "Hybrid FPGA Architecture", Proceedings 4th International Symposium on FPGAs (FPGA 96), Feb. 1996.

"Next Generation FPGAs; Xilinx Next Generation FPGAs Deliver World–Class Performance", *The Power of Innovation 1997*, Xilinx, Inc., San Jose, CA, p. 7–7.

"Altera Enables System–Level Integration with Raphael Family of Embedded PLDs", Altera Corporation, San Jose, California, Aug. 31, 1998.

"Apex 20K Programmable Logic Device Family; Advance Product Brief", Altera Corporation, San Jose, California, Oct. 1998, pp. 1, 2, and 9.

"Altera Unveils New Name for Raphael: Advanced Programmable Embedded Matrix (APEX)", Altera Corporation, San Jose, California, Oct. 7, 1998.

"Apex 20K Device Family; The Embedded PLD Family for System–Level Integration", Altera Corporation, San Jose, California, after Aug. 31, 1998.

"Apex 20K Device Family; Breakthrough MultiCore Architecture", Altera Corporation, San Jose, California, after Aug. 31, 1998.

F. Heile et al., "Hybrid Product Term and LUT Based Architecture Using Embedded Memory Blocks", Proceedings of FPGA 1999 Conference, Feb. 21–23, 1999, Monterey, California.

\* cited by examiner

CONTENT ADDRESSABLE MEMORY ENCODED OUTPUTS

This application claims the benefit of U.S. provisional patent application No. 60/107,197, filed Nov. 5, 1998.

BACKGROUND OF THE INVENTION

This invention relates to content addressable memories, and more particularly to content addressable memories that have associated circuitry for enabling the memory to be used to perform sum-of-products logic.

Commonly assigned Heile U.S. Pat. No. 6,020,759 (which is hereby incorporated by reference herein in its entirety), shows programmable logic array integrated circuit devices that include large blocks of memory that can be used to perform product term ("p-term") or sum-of-products logic if desired. Alternatively, these large blocks of memory can be used as random access memory ("RAM") or read-only memory ("ROM"). Commonly assigned Veenstra et al. U.S. Pat. No. 6,160,419 and Heile U.S. Pat. No. 6,144,573 (both of which are hereby incorporated by reference herein in their entireties), show another possible use of such blocks of memory as content addressable memory. However, both of the just-mentioned references contemplate that significant circuitry will be devoted to providing the output signals that are generally required from a content addressable memory. Such output signals typically include (1) a Match signal for indicating whether or not any data word stored in the content addressable memory has been found to match an applied data word, and (2) address signals (e.g., in binary code) indicating the address of the word in the memory found to match the applied data word. In the Veenstra reference, for example, a second memory block may be programmed to encode addresses and provide a match signal for a first memory block acting as a content addressable memory. In the last-mentioned Heile reference separate match and address encoding circuitry is shown for providing such content addressable memory output signals.

Because it may be desired to provide content addressable memory capability on general-purpose devices (e.g., programmable logic array integrated circuit devices) which may only occasionally need to have such capability, it would be desirable not to have to dedicate too many circuit resources to providing a content addressable memory option.

In view of the foregoing, it is an object of this invention to provide improved content addressable memory capability, especially for multi-purpose circuitry such as programmable logic devices.

It is a more particular object of this invention to make it possible for a block of memory that can operate in p-term mode and that has sum-of-products output capability to be used as a content addressable memory with little or no additional circuitry being required.

SUMMARY OF THE INVENTION

These and other objects of the invention are accomplished in accordance with the principles of the invention by storing the data words to be matched in addresses in a memory block so that when a match with an applied data word is found, the p-term outputs of the memory block can be logically combined by the associated sum-of-products circuitry to provide an encoded "virtual" address of the matching, stored data word. For example, each word to be matched has an associated unique virtual address in the content addressable memory. In order for the sum-of-products circuitry to encode that virtual address, each word to be matched is stored at one or more actual addresses in the memory block. The actual addresses chosen for a data word are such that when that data word matches an applied data word, the resulting one or more p-term output signals from the memory occur within groups that correspond to the code for the virtual address associated with the matching data word. For example, the virtual address code may be binary code. In that case all data words with odd virtual addresses will be stored in actual addresses that produce p-terms that feed sum-of-products circuitry for producing the least significant bit of the encoded virtual address. Continuing with this example, all data words with virtual addresses that need to be encoded using a 1 in the next-to-least-significant place of the binary-encoded virtual address will be stored in actual addresses that produce p-terms feeding sum-of-products circuitry for producing the next-to-least-significant bit of the encoded virtual address. A very small amount of additional circuitry (e.g., one programmable logic module in a programmable logic device that includes the memory block) can be used to form the logical OR of the encoded virtual address signals to provide a Match output signal for the content addressable memory feature.

Further features of the invention, its nature and various advantages will be more apparent from the accompanying drawings and the following detailed description of the preferred embodiments.

DETAILED DESCRIPTION OF THE PREFERRED EMBODIMENTS

Figure 1:
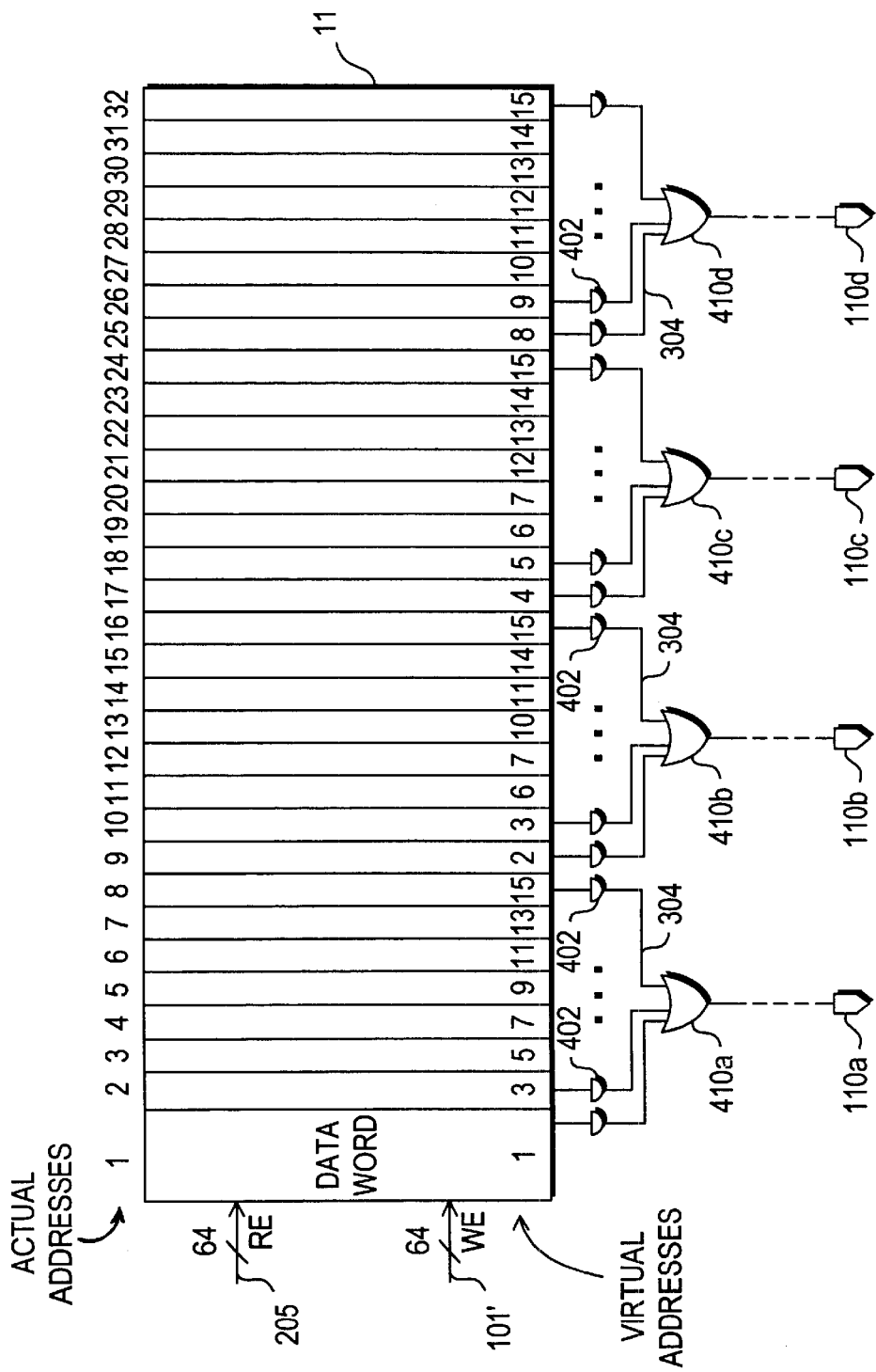
FIG. 1 is a simplified schematic block diagram showing illustrative content addressable memory circuitry with various data words stored in its several memory locations in accordance with this invention.

FIG. 1 shows an illustrative block of memory 11 and associated sum-of-products output circuitry 402/304/410/110, all of which may be similar to the correspondingly numbered elements in abovementioned U.S. Pat. No. 6,144,573. Elements 101' and 205 in FIG. 1 are also similar to the correspondingly numbered elements in the last-mentioned reference. Memory block 11 can store 32 32-bit data words in content addressable memory mode. Memory block 11 may also be capable of operating in other modes such as random access memory ("RAM") mode, read-only memory ("ROM") mode, general product term ("p-term") mode, general sum-of-products mode, etc., as described in the above-mentioned references, but it will not be necessary to discuss these various possibilities in detail herein. Examples of programmable logic devices that can include memory blocks 11 and associated circuitry in accordance with this invention are shown in Cliff et al. U.S. Pat. No. 5,550,782, Cliff et al. U.S. Pat. No. 5,689,195, Cliff et al. U.S. Pat. No. 5,909,126, Cliff et al. U.S. Pat. No. 5,963,049, and Jefferson et al. U.S. Pat. No. 6,215,326, all of which are hereby incorporated by reference herein in their entireties.

For purposes of the present invention memory block 11 may be thought of as having 32 physical or "actual" address locations 1–32, each of which is capable of storing one 32-bit data word. A data word may be stored in memory block 11 by applying data for that word to the memory block via leads 205 while enabling the desired location(s) 1–32 to store that data. When the data word stored in any of locations 1–32 matches a data word applied to the memory block via leads 101', the p-term output(s) 402/304 of the location(s) containing the matching data word become(s) logic 1. Otherwise the p-term outputs 402/304 are logic 0.

In accordance with this invention as many as 15 different data words to be compared to an applied data word can be stored in the 32 actual address locations 1–32 in memory block 11. Each of these 15 data words has a uniquely associated "virtual" address 1–15 in memory block 11. Also in accordance with this invention the p-term outputs 402/304 of the 32 actual address locations in memory block 11 are grouped in four groups of eight. This grouping of the p-terms is effected by sum-of-products OR gates 410a–d. With reference to FIG. 3 of above-mentioned U.S. Pat. No. 6,144,573, for example, each of OR gates 410a–d herein represents four sum-of-products OR gates 410 that are connected in a chain by leads 408 IN and 408 OUT. Thus each of OR gates 410a–d produces a respective output signal 110a–d that is the logical OR of eight adjacent p-terms from eight adjacent actual address locations in memory block 11. (Referring again to FIG. 3 in the last-mentioned reference, each of outputs 110a–d corresponds to the output signal 110 associated with the last of the four OR gates 410 in the chain represented by the associated one of OR gates 410a–d herein.) Each of output signals 110a–d is used to represent one place of a four-bit binary encoding of the virtual address of the stored data word that matches the applied data word.

In order to produce the appropriate output signals 110a–d, each data word to be compared to the applied data word is stored in an actual address location associated with each signal 110a–d that must be logic 1 to properly encode the virtual address of that stored data word. Assuming, for example, that output signal 110a is used for the least significant (2 to the zero power) bit of the four-bit, binary-encoded, virtual address, each data word that has an odd virtual address is stored in a respective one of the actual address locations that are associated with output signal 110a. Thus as FIG. 1 shows, the data words with virtual addresses 1, 3, 5, 7, 9, 11, 13, and 15 are stored in the eight actual address locations 1–8 that are associated with output signal 110a. Accordingly, when any of these stored data words matches the data word applied to memory block 11 via leads 205, the associated p-term 402/304 will be logic 1. This will cause the output signal of OR gate 410a and thus output signal 110a to also be logic 1.

Continuing with the example begun above, each of the stored data words that must contribute a logic 1 to the next-most-significant (2 to the first power) place of the binary virtual address is stored in a respective one of the eight actual address locations 9–16 associated with output signal 110b. Thus as shown in FIG. 1, data words with virtual addresses 2, 3, 6, 7, 10, 11, 14, and 15 are stored in actual address locations 9–16. Output signal 110b will be logic 1 whenever any of these stored data words matches the data signals applied via leads 205.

Continuing still further with this example, each of the data words that must contribute logic 1 to the next-most-significant (2 to the second power) place of the binary-encoded virtual address is stored in a respective one of the eight actual address locations 17–24 associated with output signal 110c. Thus data words with virtual addresses 4, 5, 6, 7, 12, 13, 14, and 15 are stored in actual address locations 17–24. Accordingly, when any of these data words matches the data word applied via leads 205, the associated p-term 402/304 will be logic 1, so that the output of OR gate 410c and thus output signal 110c will also be logic 1.

To conclude the example being discussed, each data word with a virtual address that must contribute logic 1 to the 2-to-the-third-power place of the binary-coded virtual address is stored in a respective one of actual address locations 25–32. Thus the data words with virtual addresses 8, 9, 10, 11, 12, 13, 14, and 15 are stored in these actual address locations. Accordingly, when any of these stored data words matches the data word applied via leads 205, the output of OR gate 410d and therefore output signal 110d will be logic 1.

To briefly recapitulate the foregoing, the data word with virtual address 1 is stored only in an actual address location associated with output signal 110a (the 2-to-the-zero-power place of the binary-coded virtual address). Accordingly, if this stored data word matches the data word applied via leads 205, only output signal 110a will be logic 1, giving a binary address of 0001, which is the binary code for virtual address 1. The data word with virtual address 6 is stored in actual address locations associated with output signals 110b and 100c. Accordingly, if this stored data word matches the data word applied via leads 205, output signals 110b and 110c will be logic 1, giving a binary address of 0110, which is the binary code for virtual address 6.

From the foregoing it will be seen that some data words are stored in only one actual address location 1–32, some data words are stored in two actual address locations, still other data words are stored in three actual address locations, and one data word (having virtual address 15) is stored in four actual address locations. The number of times that a data word is stored, and the location(s) selected for storage of that data word correspond to the binary code or the virtual address of that data word.

Figure 2:
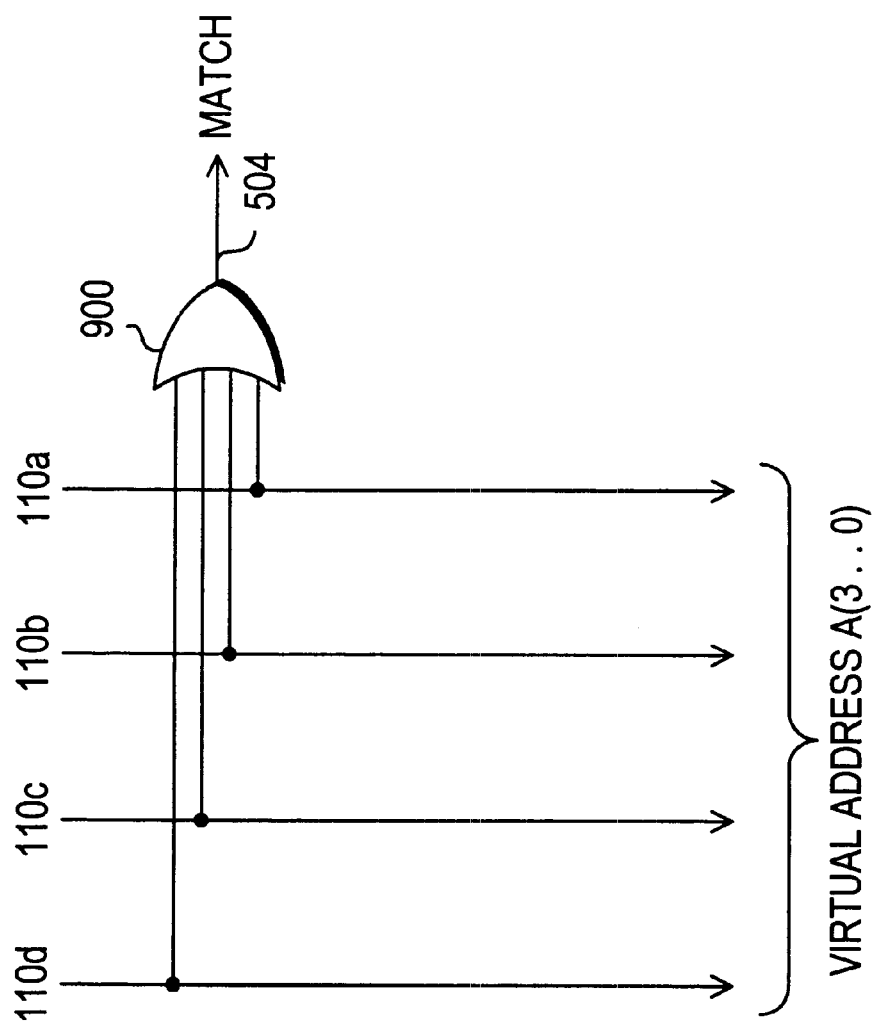
FIG. 2 is a simplified schematic block diagram of an illustrative embodiment of additional circuitry that can be used with the FIG. 1 circuitry in accordance with the invention.

FIG. 2 shows that if, in addition to binary-coded virtual address output signals A(3 . . . 0) on leads 110a–d, it is desired to produce a Match output signal 04 whenever any of the 15 stored data words is found to match the data word applied via leads 205, output signals 110a–d can be additionally applied to OR gate 900. Match signal 504 will then be logic 1 whenever any of signals 110a–d is logic 1. Assuming that the circuitry shown in FIG. 1 is part of a programmable logic device, only a single, relatively simple logic element or module may be required to perform the function represented by OR gate 900 and thereby provide Match signal 504.

The foregoing demonstrates that, as a result of this invention, nothing (or almost nothing) has to be added to the circuitry shown in above-mentioned U.S. Pat. No. 6,020,759 to enable that circuitry to function as a content addressable memory providing typical content addressable memory output signals (i.e., address A and Match output signals). The address signals (e.g., in binary code) appear on selected output leads 110. A single logic element or module can combine the address signals to provide the Match signal.

If a content addressable memory able to compare more than 15 stored data words is desired, memory block 11 can be provided with more actual address locations. Alternatively, multiple memory blocks 11 can be used in parallel, with the A outputs of each providing the lower-order address bits and the Match signals providing higher-order address information.

The address output signals do not have to be in binary code. Any other encoding of the virtual address information can be used instead if desired. For example, the data words to be compared can be stored in memory block 11 so that their virtual address information is output in Grey code, binary coded decimal code, or any other desired code.

As was briefly indicated earlier, the data words to be compared to the applied data word can be written into memory block 11 using known writing procedures (see above-mentioned U.S. Pat. Nos. 6,020,759 and 6,144,573). For example, leads 101' are typically used to supply the data to be stored, while one (or more) of actual address locations 1–32 is (or are) selected to store that data.

It will be understood that the foregoing is only illustrative of the principles of the invention, and that various modifications can be made by those skilled in the art without departing from the scope and spirit of the invention. For example, the particular memory block size shown and described herein (both in terms of word length and number of storage locations) is only illustrative, and the invention is equally applicable to larger and smaller memory blocks. Similarly, the use of binary code is only illustrative, and other codes (some of which have been specifically mentioned) can be used instead if desired. As still another example of modifications within the scope of this invention, the particular signal or logic levels mentioned above are only illustrative, and different signal or logic levels can be used instead if desired. The particular logic devices shown and described herein are also only exemplary, and logically equivalent alternatives can be substituted if desired.

What is claimed is:

1. A method of operating a content addressable memory to produce address output signals in a code in which at least some data words stored in the memory are indicated by response of multiple ones of the address output signals comprising:

associating a respective subset of data word storage locations in the memory with each of the address output signals;

storing each data word in a data word storage location in the subset associated with each address output signal that is required to respond to indicate that data word; and for each subset, combining responses to an applied data word from each data word storage location in that subset to produce the address output signal associated with that subset.

2. The method defined in claim 1 wherein the code is binary code having a plurality of places, and wherein each of the subsets is associated with a respective one of the places.

3. The method defined in claim 2 wherein each of the data words has a respective virtual address which is to be indicated by the address output signals, and wherein each data word is stored in a data word storage location associated with each of the places for which the virtual address of that data word in binary code is logic 1.

4. The method defined in claim 1 wherein for each subset the combining includes forming the logical OR of the responses to an applied data word from each data word storage location in that subset.

5. The method defined in claim 1 further comprising:

detecting a response in any of the address output signals in order to produce a Match output indicating that one of the data words has responded to the applied data word.

* * * * *